(12) United States Patent
Oryoji

(10) Patent No.: US 7,094,688 B2
(45) Date of Patent: Aug. 22, 2006

(54) METHOD FOR MANUFACTURING SEMICONDUCTOR DEVICE

(75) Inventor: Michio Oryoji, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/696,588

(22) Filed: Oct. 30, 2003

(65) Prior Publication Data
US 2004/0132278 A1 Jul. 8, 2004

(30) Foreign Application Priority Data
Oct. 31, 2002 (JP) ............................. 2002-318166

(51) Int. Cl.
*H01L 21/4763* (2006.01)
*H01L 21/461* (2006.01)
*H01L 21/31* (2006.01)

(52) U.S. Cl. ...................... 438/638; 438/634; 438/725; 438/786

(58) Field of Classification Search ........ 438/637–640, 438/634, 725, 740
See application file for complete search history.

(56) References Cited

U.S. PATENT DOCUMENTS 6,399,483 B1 6/2002 Liu 6,787,907 B1 * 9/2004 Watanabe et al. ........... 257/758
6,794,293 B1 * 9/2004 Li et al. ...................... 438/700

FOREIGN PATENT DOCUMENTS

JP 2000-188329 7/2000

OTHER PUBLICATIONS

Office Action (with English language translation) from Taiwanese Patent Office received on Sep. 23, 2004.

* cited by examiner

*Primary Examiner*—Ha Tran Nguyen
(74) *Attorney, Agent, or Firm*—Westerman, Hattori, Daniels & Adrian, LLP.

(57) ABSTRACT

A via hole is first formed, and an embedded material is embedded in the via hole. A height of the embedded material is adjusted so that a surface thereof is between an upper surface of an SiOC film and that of an SiC film. After this, an SiN film, a TEOS film, and the SiOC film are etched by using a resist mask as a mask. However, etching of the SiOC film is stopped when a bottom of a trench formed in the SiOC film is lower than an upper surface of the embedded material and higher than that of the SiC film. Then, the resist mask and the embedded material are removed. The SiOC film is etched again by using the SiN film as a mask, and the SiN film and an exposed part of the SiC film are removed.

21 Claims, 10 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2002-318166, filed on Oct. 31, 2002, the entire contents of which are incorporated herein by reference.

BACKGROUND OF THE INVENTION

1. Field of the Invention

The present invention relates to a method for manufacturing a semiconductor device suitable for forming wiring layers 2. Description of the Related Art Via-first dual damascene for which an SiO group interlayer insulating film is used is adopted in recent microfabrication of wiring layers. In the dual damascene, occurrence of a fence between vias or a level difference in a via is restrained by controlling a height of an embedded material. When controlling the height thereof, the height of the embedded material corresponds to a height of one of the interlayer insulating film lying on a lower side.

Meanwhile, a low dielectric constant film is used as the interlayer insulating film between the wiring layers with an aim of lowering parasitic capacitance between the wiring layers or the like in order to enable high-speed operation.

A prior art is described in Japanese Patent Laid-open No. 2000-188329.

Also, when forming via-first dual damascene for which an SiOC group interlayer insulating film having low dielectric constant is used, occurrence of the fence between the vias or the level difference in the via needs to be restrained by controlling the height of the embedded material in the via.

Here, a problem when the height of the embedded material is inappropriately controlled according to a conventional manufacturing method is explained.

The problem when the height of the embedded material is too high is explained hereinafter. FIG. 6A to FIG. 6D are cross-sectional views showing a method for manufacturing a semiconductor device in order of processes when the height of the embedded material is too high.

As shown in FIG. 6A, on a wiring 101, an SiC film 102, an SiOC film 103, an SiC film 104, an SiOC film 105, a TEOS (Tetra Ethyl Ortho Silicate) film 106, and an SiN film 107 are first formed in this order. Then, a via hole 108 is formed in the SiN film 107, the TEOS film 106, the SiOC film 105, the SiC film 104, and the SiOC film 103. Thereafter, an embedded material 109 is embedded in the via hole 108. In this example, a surface of the embedded material 109 is between an upper surface of the SiOC film 105 and that of the Sic film 104. In other words, the embedded material 109 is higher than the SiOC film 105. After this, a resist mask 110 is formed by applying a resist on all surfaces and patterning it.

Next, as shown in FIG. 6B, the SiN film 107, the TEOS film 106, and the SiOC film 105 are etched by using the resist mask 110 as a mask until a surface of the SiC film 104 is exposed. As a result of this etching, a part of the SiOC film 105 remains on a side of the embedded material 109.

After this, as can be seen in FIG. 6C, the resist mask 110 and the embedded material 109 are removed by ashing.

Next, as shown in FIG. 6D, the SiC films 102 and 104 are removed by etching. At the same time, the SiN film 107, which has low etching selectivity against the SiC films 102 and 104, is removed. As a result of this etching, a trench 112 is formed, and the wiring 101 is exposed.

Thereafter, embedding of a wiring (not shown) or the like is carried out.

As described above, when the height of the embedded material 109 is too high according to the conventional manufacturing method, the part of the SiOC film 105 remaining on the side of the embedded material 109 during the process shown in FIG. 6B remains as it is in the trench 112, as shown in FIG. 6D.

The problem when the height of the embedded material is too low is explained hereinafter. FIG. 7A to FIG. 7D are cross-sectional views showing the method for manufacturing the semiconductor device in order of the processes when the height of the embedded material is too low.

First, as shown in FIG. 7A, the processes are carried out until the embedded material 109 is embedded in the via hole 108 in the same way as shown in FIG. 6A. However, in this example, the surface of the embedded material 109 is between an upper surface of the SiC film 102 and that of the SiOC film 103. In other words, the embedded material 109 is lower than the SiOC film 103. Then, the resist mask 110 is formed by applying the resist on all the surfaces and patterning it.

Then, as shown in FIG. 7B, the SiN film 107, the TEOS film 106, and the SiOC film 105 are etched by using the resist mask 110 as a mask until the surface of the SiC film 104 is exposed. In this example, the embedded material 109 is lower than the height at which the SiC film 104 is formed; therefore, an edge of the SiC film 104 is somewhat etched during this etching process. Consequently, a part of the SiOC film 103 covered by an etched part of the SiC film 104 is etched deeper than the upper surface of the embedded material 109. Accordingly, a level difference occurs on the SiOC film 103.

After this, as can be seen in FIG. 7C, the resist mask 110 and the embedded material 109 are removed by ashing.

Next, as shown in FIG. 7D, the SiC films 102 and 104 are removed by etching. At the same time, the SiN film 107, which has low etching selectivity against the SiC films 102 and 104, is removed. As a result of this etching, the trench 112 is formed, and the wiring 101 is exposed.

Thereafter, embedding of the wiring (not shown) or the like is carried out.

As described above, when the height of the embedded material 109 is too low according to the conventional manufacturing method, the level difference formed on the SiOC film 103 during the process shown in FIG. 7B remains as it is, as shown in FIG. 7D.

Therefore, as explained above, the height of the embedded material 109 needs to be strictly controlled.

However, the fence between the vias or the level difference in the via occur due to influence of resist poisoning or difficulty in controlling the height of the embedded material. These problems lead to decrease of process yield and reliability.

SUMMARY OF THE INVENTION

The present invention was invented in consideration of the above-mentioned problems. It is an object of the present invention to provide a method for manufacturing a semiconductor device which prevents occurrence of a fence between vias and a level difference in a via when a low dielectric constant film is used as an interlayer insulating film in dual damascene.

The inventor of the present invention made up following aspects of the invention after extremely careful consideration.

The method for manufacturing the semiconductor device relating to the present invention is intended for the method for manufacturing the semiconductor device including steps of forming a wiring by a dual damascene method. According to the method for manufacturing the semiconductor device, a cap film, a first interlayer insulating film, an etching stopper film, a second interlayer insulating film, and a hard mask are first formed in this order on a conductive layer, and a via hole which reaches the cap film is formed in the hard mask, the second interlayer insulating film, the etching stopper film, and the first interlayer insulating film. Then, an embedded material higher than the first interlayer insulating film and lower than a layered stack composed of the first interlayer insulating film, the etching stopper film, and the second interlayer insulating film is embedded in the via hole. A trench whose bottom is higher than an upper surface of the etching stopper film and lower than that of the embedded material is formed in the second interlayer insulating film by etching the hard mask and the second interlayer insulating film, using a resist mask in which an opening for exposing the embedded material is formed. Then, the resist mask and the embedded material are removed, and the second interlayer insulating film is etched again by using the hard mask as a mask. After this, a wiring trench is formed by removing the hard mask, and exposed parts of the etching stopper film, and the cap film. An electric conductive film is embedded in the via hole and the wiring trench.

According to the present invention, etching is carried out twice when the wiring trench is formed in the second interlayer insulating film. In other words, the first etching is carried out until a place which is lower than the embedded material and which does not reach the etching stopper film. After removing the resist mask and the embedded material, the wiring trench which reaches the etching stopper film is formed by the second etching. Therefore, even if the fence is formed along the embedded material during the first etching, the fence disappears during the second etching so that the via hole and the wiring trench of any desired shape can be obtained.

DETAILED DESCRIPTION OF THE PREFERRED EMBODIMENTS

A specific explanation of a method for manufacturing a semiconductor device relating to an embodiment of the present invention is given hereinafter with reference to the attached drawings. FIG. 1A to FIG. 1F are cross-sectional views showing the method for manufacturing the semiconductor device in order of processes relating to the embodiment of the present invention.

Figure 1A:
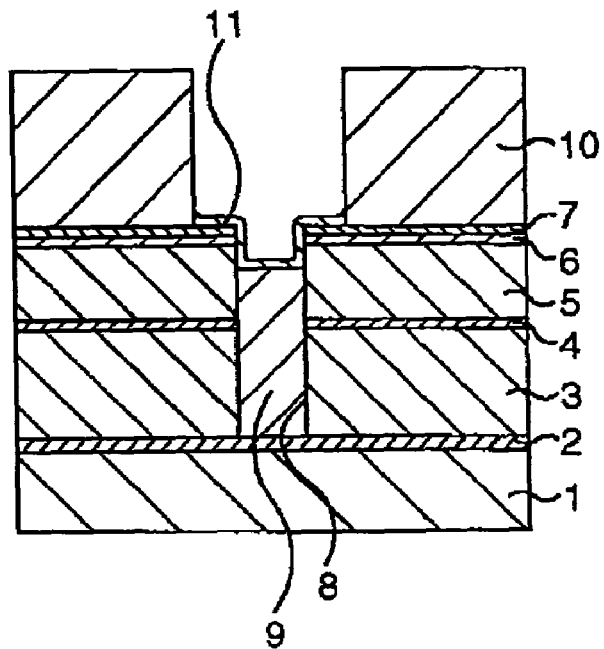
FIG. 1A to FIG. 1F are cross-sectional views showing a method for manufacturing a semiconductor device in order of processes relating to an embodiment of the present invention.

According to the embodiment, microchips such as a transistor, a capacitor, and the like are first formed on a semiconductor substrate (not shown), and an interlayer insulating film (not shown), a wiring 1, and the like are formed thereon as shown in FIG. 1A.

Furthermore, as shown in FIG. 1A, on the wiring 1, an SiC film 2 as a cap film, an SiOC film 3 as a first interlayer insulating film, an SiC film 4 as an etching stopper layer, an SiOC film 5 and a TEOS (Tetra Ethyl Ortho Silicate) film 6 as second interlayer insulating film, and an SiN film 7 as a hard mask are formed in this order. Film thickness of them is as follows: for example, the SiC film 2; 70 nm thick, the SiOC film 3; 550 nm thick, the Sic film 4; 30 nm thick, the SiOC film 5; 370 nm thick, the TEOS film 6; 30 nm thick, and the SiN film 7; 50 nm thick.

Then, a via hole 8 is formed in the SiN film 7, the TEOS film 6, the SiOC film 5, the SiC film 4, and the SiOC film 3 by using a resist mask (not shown) as a mask. Dry etching for which, for example, $CF_4$ and $O_2$ are used, is carried out when the via hole 8 is formed. Thereafter, an embedded material 9 such as a resist made of, for example, an organic material, is embedded in the via hole 8. A height of the embedded material 9 is adjusted so that a surface thereof is between an upper surface of the SiOC film 5 and that of the SiC film 4. In other words, the height of the embedded material 9 is adjusted so that it is higher than the SiOC film 3 and lower than a layered stack composed of the SiOC film 3, the SiC film 4, the SiOC film 5 and the TEOS film 6. The height of the embedded material 9 is adjusted so that a bottom of a trench formed in the SiOC film 5 is lower than the upper surface of the embedded material 9 even if the embedded material 9 is etched when etching the SiN film 7, the TEOS film 6, and the SiOC film 5 in a later process.

Next, a resist mask 10 is formed by applying the resist on all surfaces and patterning it. At this time, a resist residue 11 generates in an opening of the resist mask 10 due to influence of resist poisoning.

Figure 1B:
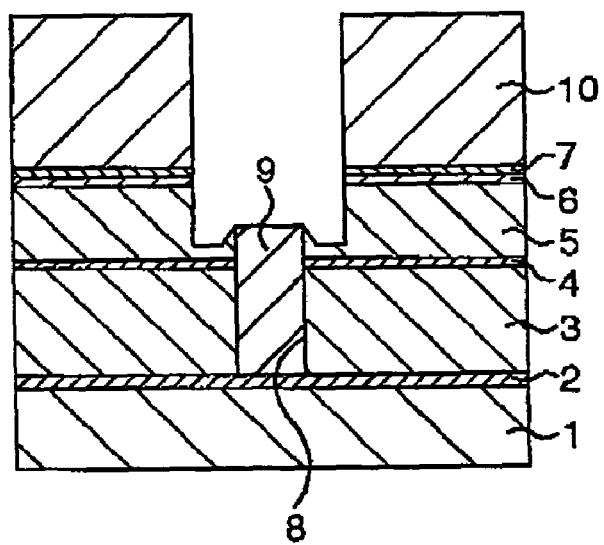

Then, the SiN film 7, the TEOS film 6, and the SiOC film 5 are etched by using the resist mask 10 as a mask. However, according to the embodiment, as shown in FIG. 1B, the etching of the SiOC film 5 is stopped when the bottom of the trench formed in the SiOC film 5 is lower than the upper surface of the embedded material 9 and higher than that of the SiC film 4. The resist residue 11 is completely removed during this etching.

Figure 1C:
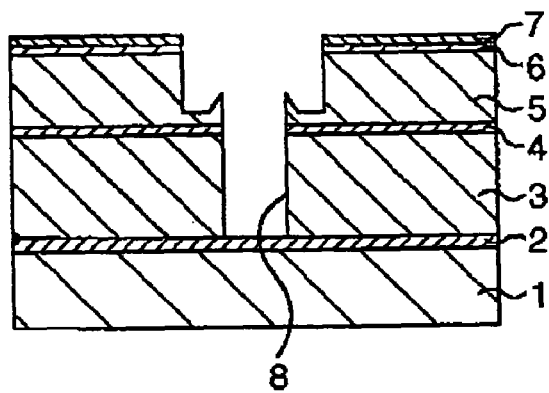

Thereafter, as can be seen in FIG. 1C, the resist mask 10 and the embedded material 9 are removed by ashing. A fence is formed on the SiOC film 5 at this time.

Figure 1D:
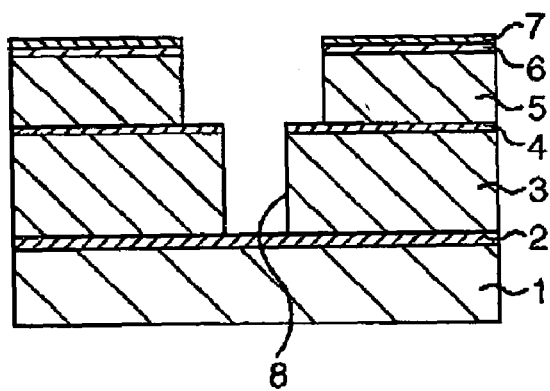

After this, as shown in FIG. 1D, the SiOC film 5 is etched by using the hard mask 7 as a mask. For example, $CF_4$ and $O_2$ are used for this etching. The etching of the SiOC film 5 is completely stopped when exposing the surface of the SiC film 4 since etching selectivity between the SiOC film 5 and the Sic film 4 is high. The fence of the SiOC film 5 completely disappears as a result of this etching.

Figure 1E:
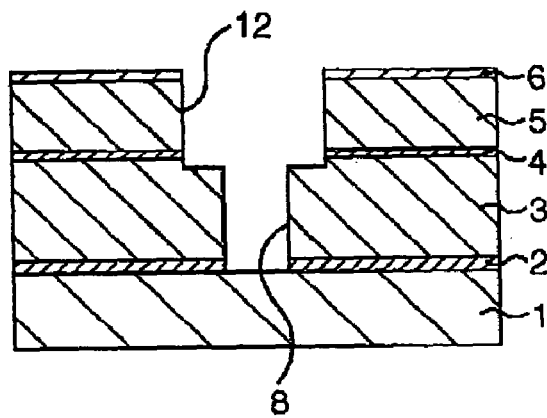

Next, as can be seen in FIG. 1E, the SiC films 2 and 4 are removed by etching. For example, $CHF_3$ or $CH_2F_2$, $N_2$ and $O_2$ are used for this etching. At the same time, the SiN film 7, which has low etching selectivity against the SiC films 2 and 4, is removed. As a result of this etching, a trench (a wiring trench) 12 is formed, and further, the wiring 1 is exposed.

Figure 1F:
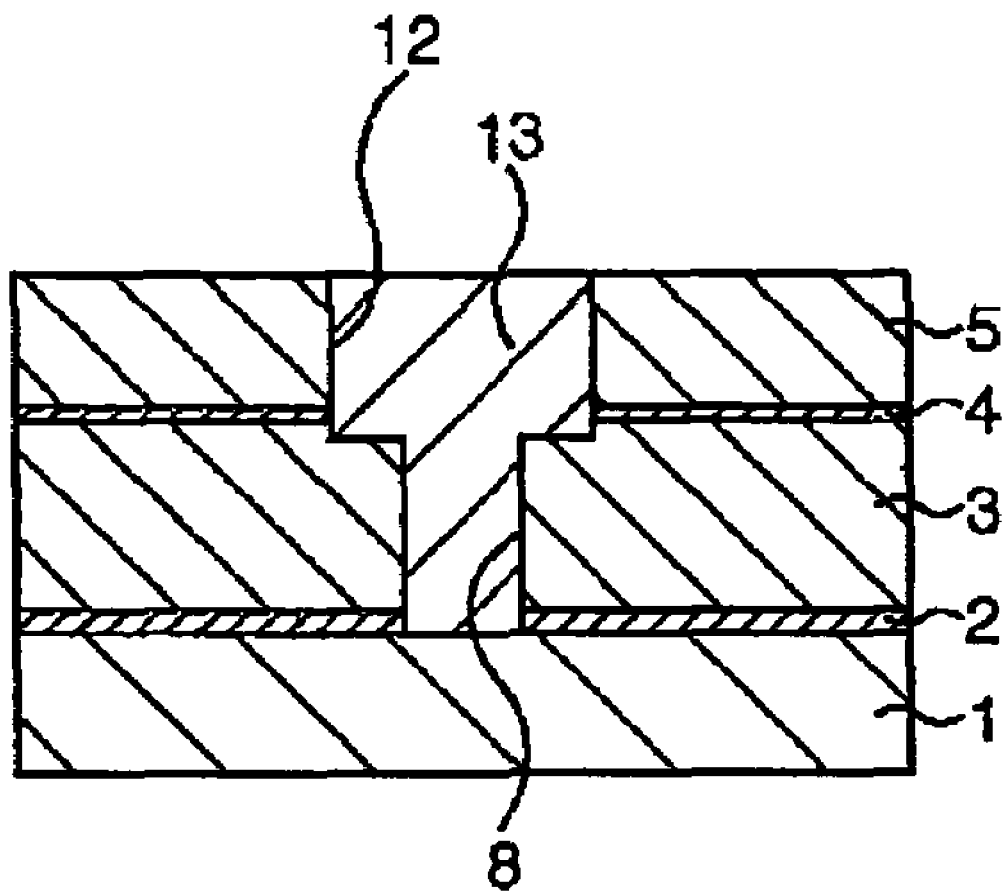

Then, after a barrier metal film (not shown) and a seed metal film (not shown) composed of Cu are formed on a side of the via hole 8 and that of the trench 12, a Cu film (a metal film) is grown by a plating method as shown in FIG. 1F. A Cu wiring 13 is formed by planarizing the Cu film and the like. At the same time, the TEOS film 6 is removed. The semiconductor device is completed by forming other interlayer insulating films, wirings, and the like as necessary.

Figure 2:
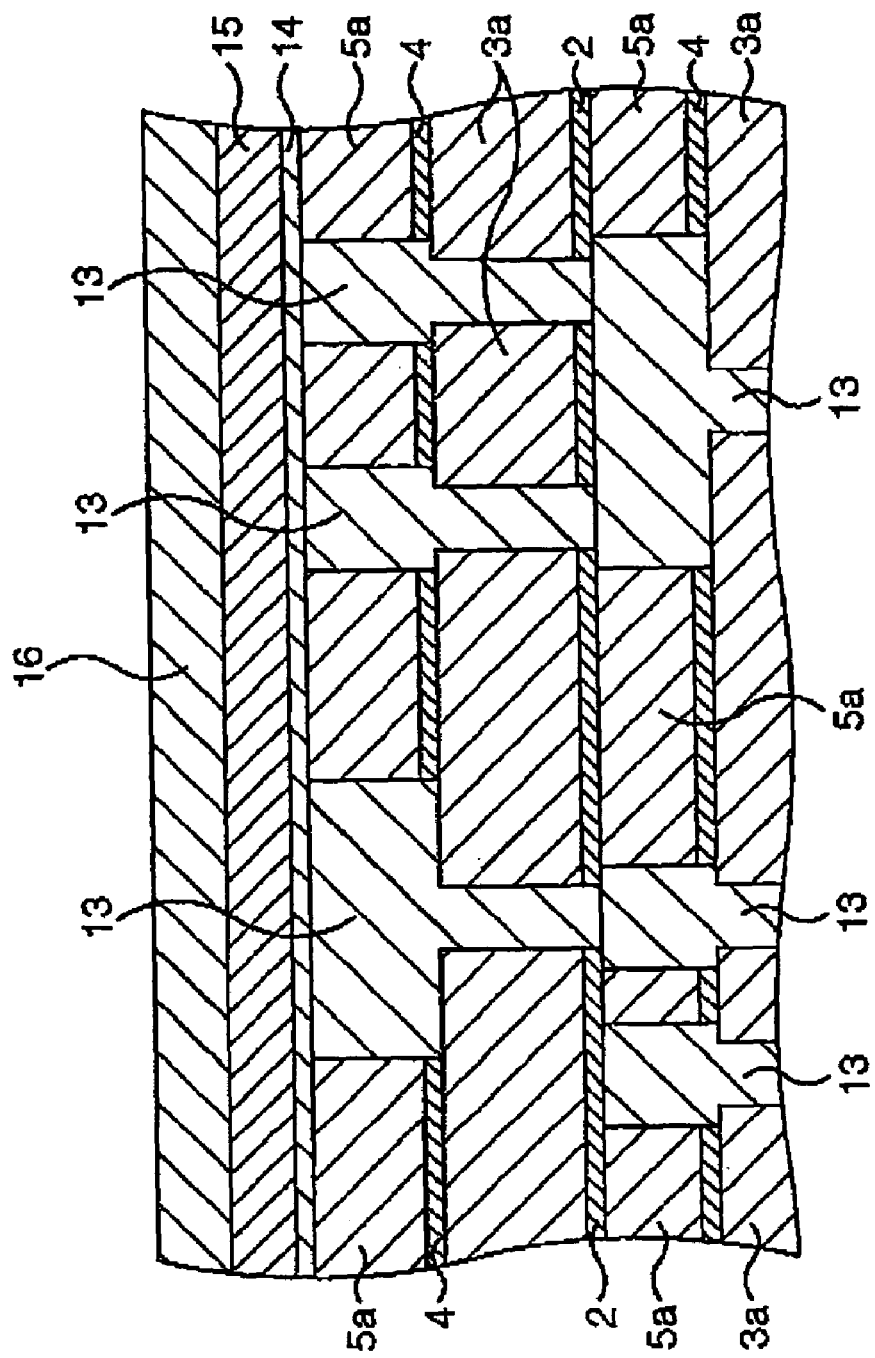
FIG. 2 is a cross-sectional view showing a structure of the semiconductor device manufactured by applying the embodiment.

FIG. 2 is a cross-sectional view showing a structure of the semiconductor device manufactured by applying the embodiment. In an example shown in FIG. 2, at least double layer multilayered wirings are formed according to the manufacturing method relating to the aforementioned embodiment. Interlayer insulating film 3a in FIG. 2 correspond to the SiOC film 3, and interlayer insulating film 5a corresponding to the SiOC film 5. A passivation layer 14 made of SiC or the like is formed on the uppermost Cu wirings 13 and the interlayer insulating film 5a. Furthermore, a cover film composed of an SiO film 15 and an $Si_3N_4$ film 16 is formed on the passivation layer 14. An opening (not shown) for taking out a pad is accordingly formed in the cover film.

As described above, according to the manufacturing method relating to the embodiment, occurrence of a fence and that of a level difference can be prevented even if the height of the embedded material 9 is not strictly adjusted and even if resist poisoning occurs. Therefore, process yield and reliability can be increased. Furthermore, a margin in a via-first dual damascene method can be improved because the height of the embedded material 9 does not have to be strictly adjusted.

The SiOC films are used as the interlayer insulating films in the aforementioned embodiment. However, same effect can be obtained when SiO films are used.

Figure 3:
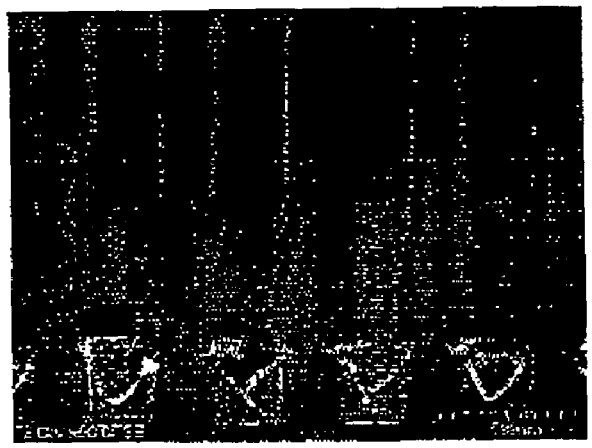
FIG. 3 is a microphotograph showing shapes of via holes in the embodiment of the present invention.
Figure 4:
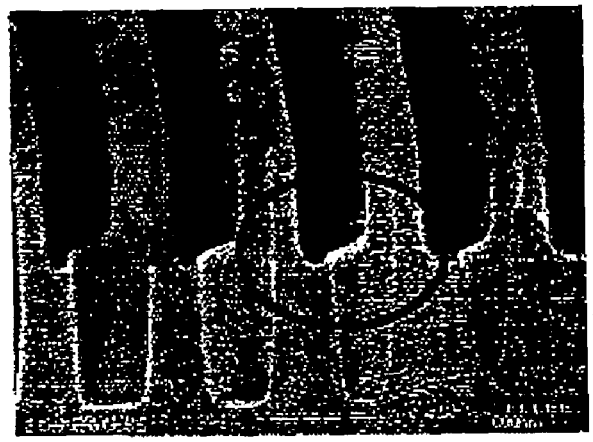
FIG. 4 is a microphotograph showing the shapes of the via holes when heights of embedded materials are too high in a conventional manufacturing method.
Figure 5:
FIG. 5 is a microphotograph showing the shapes of the via holes when heights of the embedded materials are too low in the conventional manufacturing method.
Figure 6A:
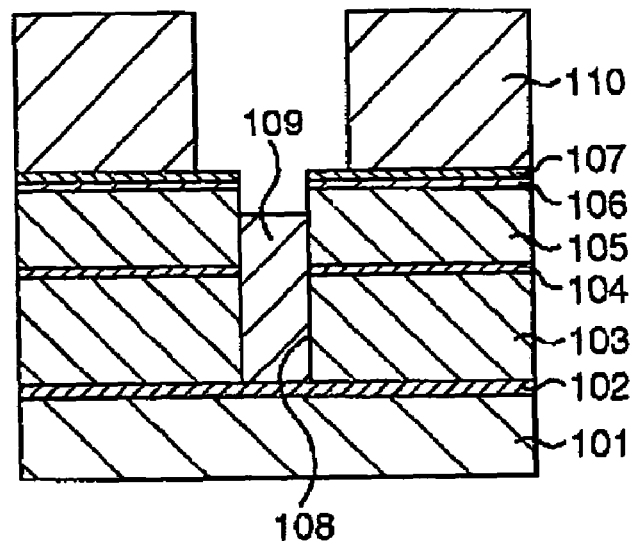
FIG. 6A to FIG. 6D are cross-sectional views showing the conventional method for manufacturing the semiconductor device in order of processes when the embedded material is too high.
Figure 6B:
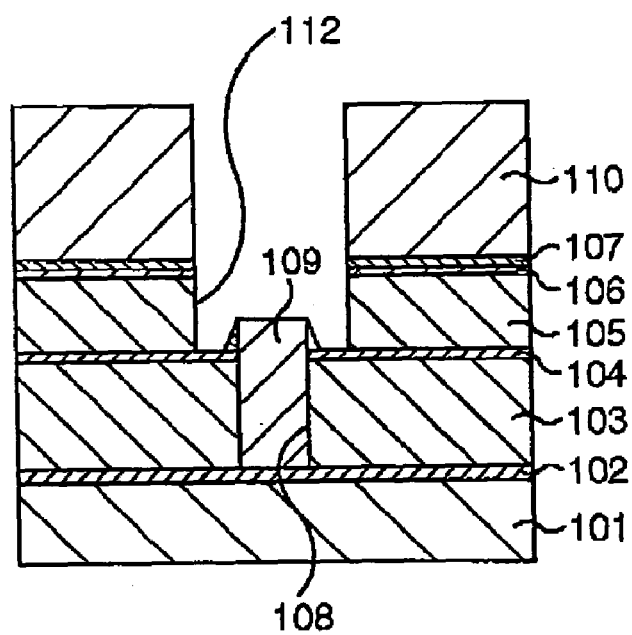
Figure 6C:
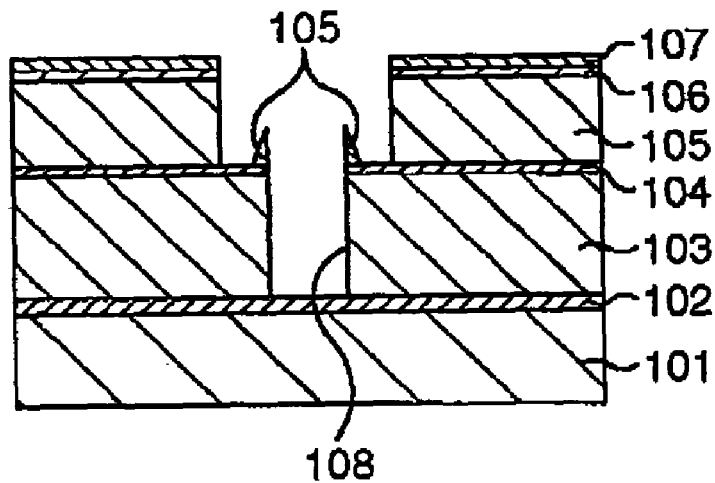
Figure 6D:
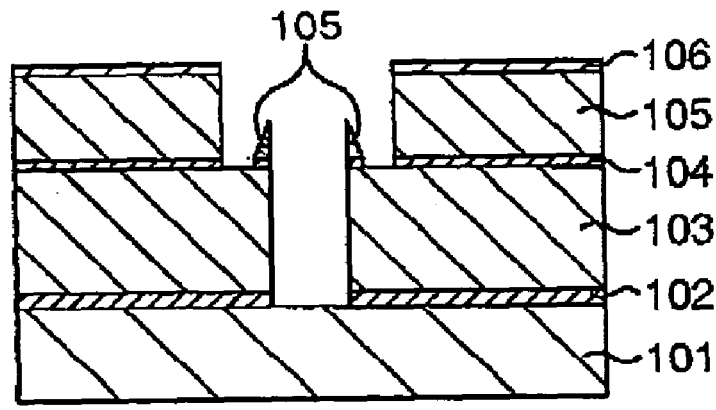
Figure 7A:
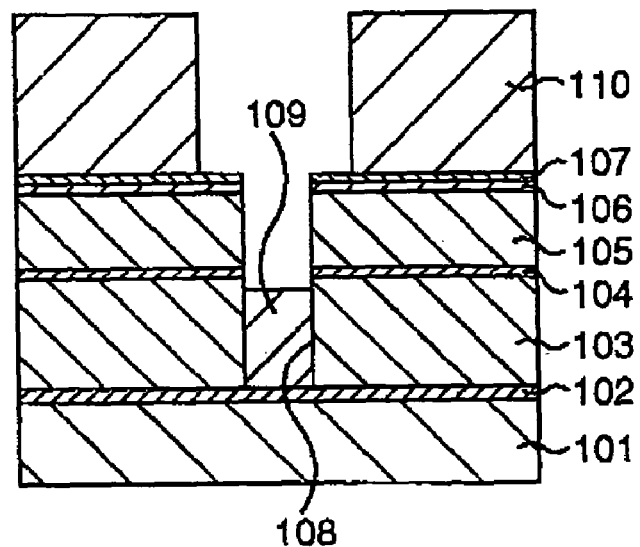
FIG. 7A to FIG. 7D are cross-sectional views showing the conventional method for manufacturing the semiconductor device in order of processes when the embedded material is too low.
Figure 7B:
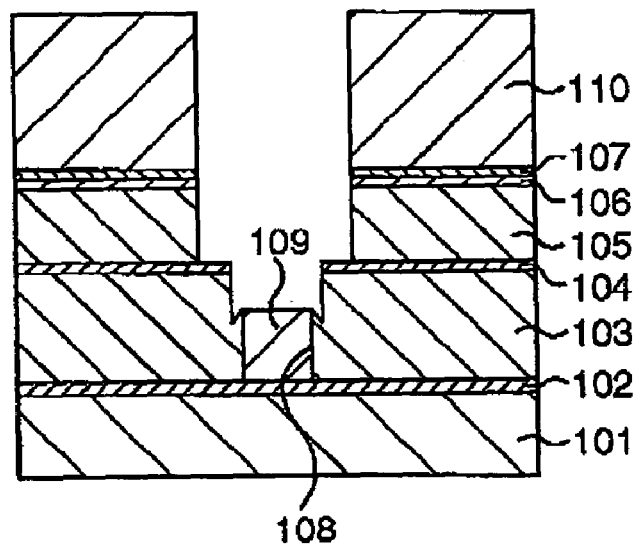
Figure 7C:
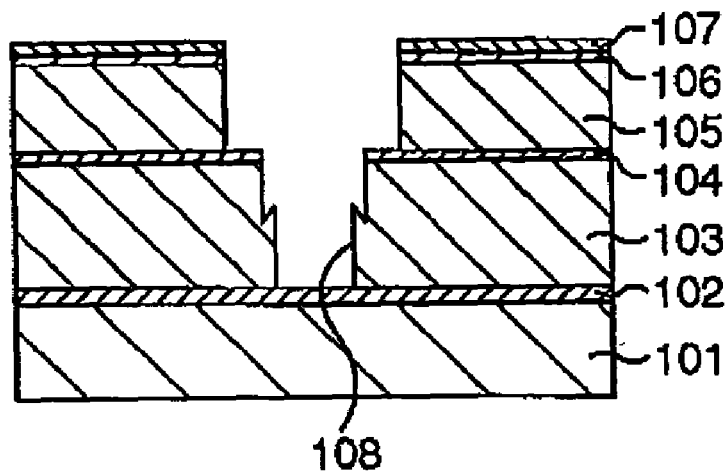
Figure 7D:
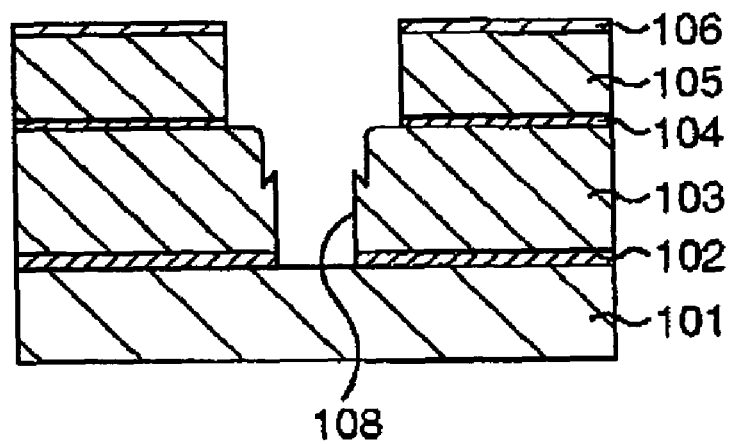

A result of an examination of the via hole under a microscope when the inventor of the present invention actually manufactured semiconductor devices is explained hereinafter. FIG. 3 is a microphotograph showing shapes of the via holes according to the aforementioned embodiment. FIG. 4 is a microphotograph showing the shapes of the via holes when the embedded materials were too high according to a conventional manufacturing method. FIG. 5 is a microphotograph showing the shapes of the via holes when the embedded materials were too low according to the conventional manufacturing method.

As shown in FIG. 3, according to the embodiment of the present invention, neither the fence between the vias nor the level difference in the via existed. In contrast, as shown in FIG. 4, when the height of the embedded materials was too high according to the conventional manufacturing method, the fence existed between the vias. Furthermore, as shown in FIG. 5, when the height of the embedded materials was too low according to the conventional manufacturing method, the level difference existed in the via.

As mentioned in detail above, according to the present invention, occurrence of the fence and that of the level difference can be prevented even if the height of the embedded material is not strictly adjusted and even if the resist poisoning occurs when patterning the resist. Accordingly, process yield and reliability can be increased. Furthermore, a large margin in the via-first dual damascene method can be secured because the height of the embedded material does not have to be strictly adjusted.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method for manufacturing a semiconductor device including steps of forming a wiring by a dual damascene method, the method for manufacturing the semiconductor device comprising the steps of:
    forming a cap film, a first interlayer insulating film, an etching stopper film, a second interlayer insulating film, and a hard mask in this order on a conductive layer;
    forming a via hole which reaches the cap film in the hard mask, the second interlayer insulating film, the etching stopper film, and the first interlayer insulating film;
    embedding an embedded material to a level higher than the first interlayer insulating film and lower than the top surface of a layered stack composed of the first interlayer insulating film, the etching stopper film, and the second interlayer insulating film in the via hole;
    forming a trench in the second interlayer insulating film by etching the hard mask and the second interlayer insulating film, using a resist mask in which an opening for exposing the embedded material is formed, the whole of a bottom surface of the trench being above an upper surface of the etching stopper film and below that of the embedded material;
    removing the resist mask and the embedded material;
    etching the second interlayer insulating film again by using the hard mask as a mask after removing the resist mask and the embedded material;
    forming a wiring trench by removing the hard mask, and exposed parts of the etching stopper film, and the cap film; and
    embedded an electric conductive film in the via hole and the wiring trench.

2. The method for manufacturing the semiconductor device according to claim 1, wherein
    a height of the embedded material is adjusted in said step of embedding the embedded material so that a bottom of the trench is lower than the upper surface of the embedded material even if the embedded material is etched when etching the hard mask and the second interlayer insulating film.

3. The method for manufacturing the semiconductor device according to claim 2, wherein
    the first and the second interlayer insulating films are SiOC group insulation films.

4. The method for manufacturing the semiconductor device according to claim 3, wherein
    the etching stopper film and the hard mask are made of an identical material.

5. The method for manufacturing the semiconductor device according to claim 4, wherein
    the cap film, the etching stopper film and the hard mask are made of materials capable of being removed under an identical etching condition.

6. The method for manufacturing the semiconductor device according to claim 3, wherein
the cap film, the etching stopper film and the hard mask are made of materials capable of being removed under an identical etching condition.

7. The method for manufacturing the semiconductor device according to claim 2, wherein
the etching stopper film and the hard mask are made of an identical material.

8. The method for manufacturing the semiconductor device according to claim 7, wherein
the cap film, the etching stopper film and the hard mask are made of materials capable of being removed under an identical etching condition.

9. The method for manufacturing the semiconductor device according to claim 2, wherein
the cap film, the etching stopper film and the hard mask are made of materials capable of being removed under an identical etching condition.

10. The method for manufacturing the semiconductor device according to claim 2, wherein
said step of embedding the electric conductive film in the via hole and the wiring trench includes the steps of:
a step of forming a barrier metal film on the surface of the via hole and the wiring trench; and
a step of forming a wiring material on the barrier metal film.

11. The method for manufacturing the semiconductor device according to claim 10, wherein
said step of forming the wiring material includes the steps of:
forming a seed film on the barrier metal film; and
forming a metal film on the seed film by a plating method.

12. The method for manufacturing the semiconductor device according to claim 1, wherein
the first and the second interlayer insulating films are SiOC group insulation films.

13. The method for manufacturing the semiconductor device according to claim 12, wherein
the etching stopper film and the hard mask are made of an identical material.

14. The method for manufacturing the semiconductor device according to claim 13, wherein
the cap film, the etching stopper film and the hard mask are made of materials capable of being removed under an identical etching condition.

15. The method for manufacturing the semiconductor device according to claim 12, wherein
the cap film, the etching stopper film and the hard mask are made of materials capable of being removed under an identical etching condition.

16. The method for manufacturing the semiconductor device according to claim 1, wherein
the etching stopper film and the hard mask are made of an identical material.

17. The method for manufacturing the semiconductor device according to claim 16, wherein
the cap film, the etching stopper film and the hard mask are made of materials capable of being removed under an identical etching condition.

18. The method for manufacturing the semiconductor device according to claim 1, wherein
the cap film, the etching stopper film and the hard mask are made of materials capable of being removed under an identical etching condition.

19. A method for manufacturing a semiconductor device including steps of forming a wiring by a dual damascene method, the method for manufacturing the semiconductor device comprising the steps of:
forming a cap film, a first interlayer insulating film, an etching stopper film, a second interlayer insulating film, and a hard mask in this order on a conductive layer;
forming a via hole which reaches the cap film in the hard mask, the second interlayer insulating film, the etching stopper film, and the first interlayer insulating film;
embedding an embedded material to a level higher than the first interlayer insulating film and lower than the top surface of a layered stack composed of the first interlayer insulating film, the etching stopper film, and the second interlayer insulating film in the via hole;
forming a trench in the second interlayer insulating film by etching the hard mask and the second interlayer insulating film, using a resist mask in which an opening for exposing the embedded material is formed, the whole of a bottom surface of the trench being above an upper surface of the etching stopper film and below that of the embedded material;
removing the resist mask and the embedded material;
etching the second interlayer insulating film again by using the hard mask as a mask after removing the resist mask and the embedded material;
forming a wiring trench by removing the hard mask, and exposed parts of the etching stopper film, and the cap film;
forming a barrier metal film on the surface of the via hole and the wiring trench; and
forming a wiring material on the barrier metal film.

20. The method for manufacturing the semiconductor device according to claim 19, wherein
said step of forming the wiring material includes the steps of:
forming a seed film on the barrier metal film; and
forming a metal film on the seed film by a plating method.

21. A method for manufacturing a semiconductor device including steps of forming a wiring by a dual damaseene method, the method for manufacturing the semiconductor device comprising the steps of:
forming a cap film, a first interlayer insulating film, an etching stopper film, a second interlayer insulating film, and a hard mask in this order on a conductive layer;
forming a via hole which reaches the cap film in the hard mask, the second interlayer insulating film, the etching stopper film, and the first interlayer insulating film;
embedding an embedded material in the via hole;
forming a trench in the second interlayer insulating film by etching the hard mask and the second interlayer insulating film, using a resist mask in which an opening for exposing the embedded material is formed, the whole of a bottom surface of the trench being above an upper surface of the etching stopper film and below that of the embedded material;
removing the resist mask and the embedded material after removing the resist mask and the embedded material;
etching the second interlayer insulating film again by using the hard mask as a mask;
forming a wiring trench by removing the hard mask, and exposed parts of the etching stopper film, and the cap film; and
embedded an electric conductive film in the via hole and the wiring trench.

* * * * *